(12) United States Patent
Kim

(10) Patent No.: US 10,777,606 B2
(45) Date of Patent: Sep. 15, 2020

(54) SEMICONDUCTOR MEMORY DEVICE AND SEMICONDUCTOR MEMORY MANUFACTURING APPARATUS

(71) Applicant: Samsung Electronics Co., Ltd., Suwon-si, Gyeonggi-do (KR)

(72) Inventor: Jae hoon Kim, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 123 days.

(21) Appl. No.: 15/871,922

(22) Filed: Jan. 15, 2018

(65) Prior Publication Data

US 2019/0051700 A1 Feb. 14, 2019

(30) Foreign Application Priority Data

Aug. 8, 2017 (KR) .................. 10-2017-0100525

(51) Int. Cl.
*H01L 27/22* (2006.01)
*H01L 43/08* (2006.01)
(Continued)

(52) U.S. Cl.
CPC ............ *H01L 27/228* (2013.01); *C23C 14/04* (2013.01); *C23C 14/042* (2013.01); *C23C 14/225* (2013.01); *C23C 14/34* (2013.01); *C23C 14/3407* (2013.01); *C23C 14/3464* (2013.01); *C23C 14/50* (2013.01); *G11C 11/161* (2013.01); *H01F 10/3286* (2013.01); *H01J 37/3411* (2013.01); *H01J 37/3441* (2013.01); *H01L 27/224* (2013.01); *H01L 43/02* (2013.01); *H01L 43/08* (2013.01); *H01L 43/12* (2013.01); *H01F 10/123* (2013.01); *H01F 10/3254* (2013.01); *H01L 43/10* (2013.01)

(58) Field of Classification Search
CPC ....... H01L 27/228; H01L 43/02; H01L 43/08; H01L 43/12; H01L 43/10; C23C 14/04; C23C 14/34; C23C 14/50; G11C 11/161; H01F 10/3286; H01F 10/3254; H01J 37/3411; H01J 37/3441
See application file for complete search history.

(56) References Cited

U.S. PATENT DOCUMENTS

| 2013/0114336 A1* | 5/2013 | Li ........................... H01L 43/08 365/171 |
| 2015/0188037 A1* | 7/2015 | Nam ...................... H01L 43/12 257/421 |
| 2018/0374895 A1* | 12/2018 | Hsu ....................... H01L 27/228 |

FOREIGN PATENT DOCUMENTS

| JP | 4418179 B2 | 2/2010 |
| JP | 2015040330 A | 3/2015 |

(Continued)

*Primary Examiner* — Fernando L Toledo
*Assistant Examiner* — Neil R Prasad
(74) *Attorney, Agent, or Firm* — Renaissance IP Law Group LLP

(57) ABSTRACT

A first memory device includes a first magnetoresistive cell having a plurality of deposition layers. A second memory device includes a second magnetoresistive cell having a plurality of deposition layers. Each of the plurality of deposition layers of the second magnetoresistive cell corresponds to one of the plurality of deposition layers of the first magnetoresistive cell. One of the plurality of deposition layers of the second magnetoresistive cell is thinner than a corresponding deposition layer of the plurality of deposition layers of the first magnetoresistive cell.

20 Claims, 13 Drawing Sheets

(51) Int. Cl.
*H01L 43/02* (2006.01)
*G11C 11/16* (2006.01)
*H01L 43/12* (2006.01)
*H01F 10/32* (2006.01)
*C23C 14/34* (2006.01)
*C23C 14/04* (2006.01)
*C23C 14/50* (2006.01)
*H01J 37/34* (2006.01)
*C23C 14/22* (2006.01)
*H01L 43/10* (2006.01)
*H01F 10/12* (2006.01)

(56) References Cited

FOREIGN PATENT DOCUMENTS

| | | | |
|---|---|---|---|
| KR | 20080001472 | A | 1/2008 |
| KR | 20080008623 | A | 1/2008 |
| KR | 20120002821 | A | 1/2012 |
| KR | 20120113994 | A | 10/2012 |
| KR | 20160115783 | A | 10/2016 |
| KR | 101674547 | B1 | 11/2016 |

* cited by examiner

SEMICONDUCTOR MEMORY DEVICE AND SEMICONDUCTOR MEMORY MANUFACTURING APPARATUS

CROSS-REFERENCE TO RELATED APPLICATION

This application claims priority under 35 U.S.C. § 119 to Korean Patent Application No. 10-2017-0100525, filed on Aug. 8, 2017, in the Korean Intellectual Property Office (KIPO), the disclosure of which is incorporated by reference herein in its entirety.

TECHNICAL FIELD

The present inventive concept relates to a semiconductor memory device and a semiconductor memory manufacturing apparatus.

DISCUSSION OF RELATED ART

Magnetic memory devices include a magnetic tunnel junction (MTJ). The MTJ includes two magnetic layers and an insulating layer located between the magnetic layers. The MTJ has a resistance value that varies according to magnetization directions of the two magnetic layers. The resistance value of the MTJ increases when the magnetization directions of the two magnetic layers are opposite to each other, and decreases when the magnetization directions of the two magnetic layers are parallel to each other. Data are written to or read from the magnetic memory devices using a difference between resistance values of the MTJ according to the magnetization directions of the two magnetic layers.

SUMMARY

According to an exemplary embodiment of the present inventive concept, a semiconductor memory device is provided as follows. A first memory device includes a first magnetoresistive cell having a plurality of deposition layers. A second memory device includes a second magnetoresistive cell having a plurality of deposition layers. Each of the plurality of deposition layers of the second magnetoresistive cell corresponds to one of the plurality of deposition layers of the first magnetoresistive cell. One of the plurality of deposition layers of the second magnetoresistive cell is thinner than a corresponding deposition layer of the plurality of deposition layers of the first magnetoresistive cell.

According to an exemplary embodiment of the present inventive concept, a semiconductor memory device is provided as follows. A first memory device that is located in a first memory area includes a first magnetoresistive cell. A second memory device that located in a second memory area includes a second magnetoresistive cell. The first memory device has a higher operating speed and a lower retention characteristic than the second memory device.

According to an exemplary embodiment of the present inventive concept, a semiconductor memory manufacturing apparatus is provided as follows. A wafer holder supports a semiconductor wafer. A sputtering target holder is obliquely located above the wafer holder. A shielding plate is interposed between the sputtering target holder and the wafer holder. The shielding plate includes a first exposure area and a second exposure area. The first exposure area is larger than the second exposure area.

BRIEF DESCRIPTION OF DRAWINGS

These and other features of the present inventive concept will become more apparent by describing in detail exemplary embodiments thereof with reference to the accompanying drawings of which.

DETAILED DESCRIPTION OF EXEMPLARY EMBODIMENTS

Hereinafter, semiconductor memory devices and an apparatus for manufacturing the same according to exemplary embodiments of the present inventive concept will be described.

First, a semiconductor memory device according to an exemplary embodiment of the present inventive concept will be described.

Figure 1:
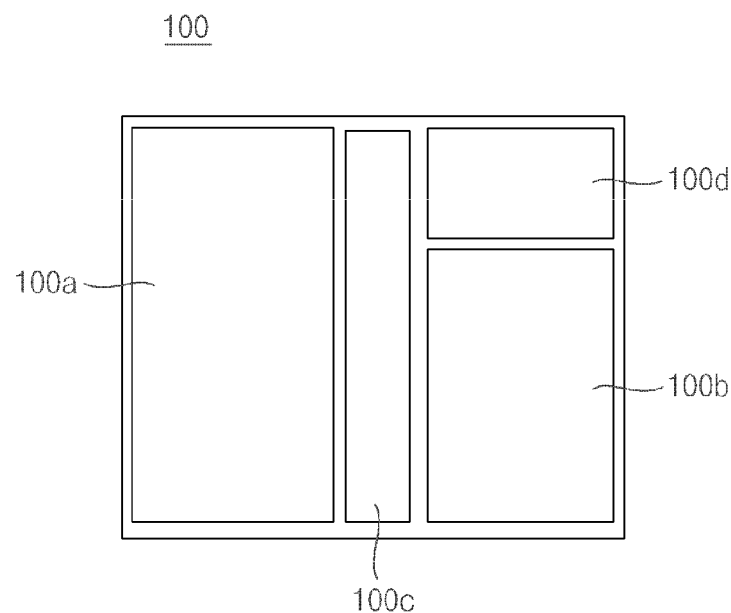
FIG. 1 is a schematic block diagram of a semiconductor memory device according to an exemplary embodiment of the present inventive concept.
Figure 2:
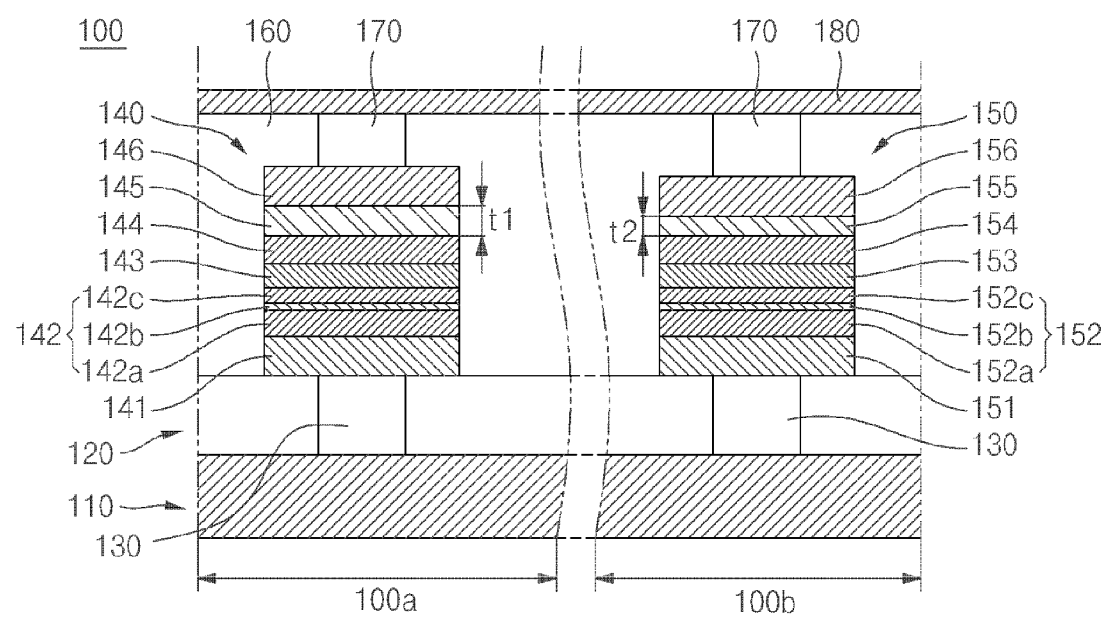
FIG. 2 shows longitudinal sectional views of memory devices formed in a first memory area and a second memory area of FIG. 1.

FIG. 1 is a schematic block diagram of a semiconductor memory device according to an exemplary embodiment of the present inventive concept, and FIG. 2 shows longitudinal sectional views of memory devices formed in a first memory area and a second memory area of FIG. 1.

Referring to FIGS. 1 and 2, a semiconductor memory device 100 includes a substrate 110, a lower insulating layer 120, lower contact plugs 130, a first memory device 140, a second memory device 150, an upper insulating layer 160, and upper contact plugs 170. The semiconductor memory device 100 further includes a bit line 180.

The semiconductor memory device 100 includes a first memory area 100a, a second memory area 100b, and a logic area 100c. The semiconductor memory device 100 further includes a radio frequency (RF) area 100d.

The semiconductor memory device 100 may be formed as a semiconductor memory device having various structures including the first memory area 100a and the second memory area 100b. The semiconductor memory device 100 may be formed as one separate memory chip. The semiconductor memory device 100 may be used as a system on chip (SoC). The semiconductor memory device 100 may be formed as a SoC including a RF function in the RF area 100d. In this case, the semiconductor memory device 100 may be formed to include a memory such as a static random access memory (SRAM) or a dynamic random access memory (DRAM), of which an operating speed or a switching speed is important, and a memory such as a flash memory of which a retention characteristic is important.

The first memory device 140 is located in the first memory area 100a and the second memory device 150 is located in the second memory area 100b. The first memory device 140 has a low retention characteristic and operates with relatively small energy to have a high operating speed. For example, the first memory device 140 has the same or similar characteristics as or to an SRAM or a DRAM. The second memory device 150 operates with relatively large energy to have a low operating speed and has a high retention characteristic. For example, the second memory device 150 has the same or similar characteristics as or to a flash memory. The first memory device 140 may mainly transmit and receive data in conjunction with a logic circuit, and may temporarily store received data. The second memory device 150 may mainly transmit and receive data in conjunction with the first memory device 140, and may store received data.

The first memory device 140 and the second memory device 150 each includes a magnetoresistive cell including a magnetic tunnel junction (MTJ). The magnetoresistive cell may be formed of a plurality of deposition layers. The first memory device 140 and the second memory device 150 have each the same stacked structure. Since a thickness of any one deposition layer of the plurality of deposition layers of the magnetoresistive cell of the first memory device 140 is different from a thickness of any one deposition layer of the plurality of deposition layers of the magnetoresistive cell of the second memory device 150, the first memory device 140 and the second memory device 150 may have different characteristics. The first memory device 140 and the second memory device 150 may be simultaneously formed by one process. The first memory device 140 and the second memory device 150 may be formed by depositing any one deposition layer thereof with different thicknesses in a deposition process performed by a semiconductor memory manufacturing apparatus of FIG. 9 described below. In an exemplary embodiment, each of the deposition layers of the magnetoresistive cell of the second memory device 150 may correspond to one of the deposition layers of magnetoresistive cell of the first memory device 140.

The logic area 100c is located between the first memory area 100a and the second memory area 100b. The first memory area 100a and the second memory area 100b are located opposite sides of the logic area 100c. The logic area 100c may include a circuit for controlling overall operations of the semiconductor memory device 100. The logic area 100c may be formed to control various operations required in the semiconductor memory device 100.

The RF area 100d may include various circuits for transmitting and receiving RF. The RF area 100d may be formed to control communication required in the semiconductor memory device 100.

The substrate 110 may be formed of a material having a semiconductor characteristic. The substrate 110 may be a silicon wafer, a silicon (Si) single crystalline substrate, a germanium (Ge) single crystalline substrate, a silicon-germanium (SiGe) single crystalline substrate, or a silicon on insulator (SOI) substrate. The substrate 110 may be a substrate in which the first memory area 100a and the second memory area 100b are integrally formed.

The lower insulating layer 120 may be formed of an insulating material. The lower insulating layer 120 may be formed of silicon oxide, silicon nitride, or silicon oxynitride. The lower insulating layer 120 covers the substrate 110. For example, the lower insulating layer 120 may cover entirely an upper surface of the substrate 110. The lower insulating layer 120 is integrally formed over the first memory area 100a and the second memory area 100b. The lower insulating layer 120 may be formed in the first memory area 100a and the second memory area 100b by one process.

The lower contact plugs 130 may be formed of an electrically conductive material. The lower contact plugs 130 may be formed of a conductor such as polysilicon, a metal material, a metal silicide, or a metal nitride. The lower contact plugs 130 vertically pass through the lower insulating layer 120 to be in contact with an upper surface of the substrate 110. The lower contact plugs 130 are formed in each of the first memory area 100a and the second memory area 100b, and the number of the lower contact plugs 130 may be equal to a sum of the number of the first memory devices 140 and the number of the second memory devices 150.

The first memory device 140 may include a first lower electrode 141, a first fixed layer 142, a first tunnel barrier layer 143, a first free layer 144, a first capping layer 145, and a first upper electrode 146. The first fixed layer 142, the first tunnel barrier layer 143, and the first free layer 144 may form an MTJ. The first fixed layer 142, the first tunnel barrier layer 143, the first free layer 144, and the first capping layer 145 may be sequentially stacked from a bottom to a top to form a first magnetoresistive cell of the first memory device 140. The first magnetoresistive cell may be electrically connected to the first lower electrode 141. The first magnetoresistive cell may be electrically connected to the first upper electrode 146. In the first magnetoresistive cell, additional layers may be formed between the first fixed layer 142, the first tunnel barrier layer 143, the first free layer 144, and the first capping layer 145.

The first memory device 140 may further include a liner (not illustrated) which surrounds a side surface of the first magnetoresistive cell. The first lower electrode 141, the first fixed layer 142, the first tunnel barrier layer 143, the first free layer 144, the first capping layer 145, and the first upper electrode 146 constituting the first memory device 140 may be arranged so that side surfaces thereof are vertically aligned with each other. The first memory device 140 in plural may be formed in the first memory area 100*a*.

The first lower electrode 141 may include a conductive material such as polysilicon, a metal, a metal alloy, or a metal silicide. The first lower electrode 141 may include a conductive metal nitride such as titanium nitride or tantalum nitride. The first lower electrode 141 may be formed on the lower insulating layer 120 to have a plate shape having a predetermined thickness and area. The first lower electrode 141 may be electrically connected to the lower contact plug 130.

The first fixed layer 142 may include CoFeB, CoFe, CoFeTb, CoFeDy, CoFeGd, CoPt, CoFePt, or FeB. The first fixed layer 142 may be formed as a single layer or a double layer. The first fixed layer 142 may be formed as a multi-layer. For example, the first fixed layer 142 includes a first lower fixed layer 142*a*, a first exchange fixed layer 142*b*, and a first upper fixed layer 142*c*. The first fixed layer 142 may further include a seed layer (not illustrated).

The first fixed layer 142 may be formed to be deposited on an upper surface of the first lower electrode 141. The first fixed layer 142 may have a magnetization direction perpendicular to the upper surface of the substrate 110. The magnetization direction of the first fixed layer 142 may be fixed without being influenced by an external magnetic field. The magnetization direction of the first fixed layer 142 may be fixed without being influenced by a magnetic field formed between the first upper electrode 146 and the first lower electrode 141.

The seed layer may include tantalum (Ta) or ruthenium (Ru). The seed layer may be formed as a single layer or a double layer. For example, the seed layer may be formed as a single layer including tantalum (Ta) or ruthenium (Ru). The seed layer may be formed as a double layer including a tantalum (Ta) layer located at a lower portion thereof and a ruthenium (Ru) layer located at an upper portion of the tantalum (Ta) layer. The seed layer may be formed to be deposited on the upper surface of the first lower electrode 141. The seed layer may determine the crystallinity or crystalline orientation of the first lower fixed layer 142*a*.

The first lower fixed layer 142*a* may include CoPt, CoPd, FePt, FePd, CoFeTb, CoFeDy, or CoFeGd. The first lower fixed layer 142*a* may be formed as a single layer or a double layer. For example, the first lower fixed layer 142*a* may be formed as a single layer of a cobalt-platinum (CoPt) layer or a cobalt-palladium (CoPd) layer. The first lower fixed layer 142*a* may be formed as a double layer in which a cobalt-platinum (CoPt) layer and a cobalt-palladium (CoPd) layer are stacked. The first lower fixed layer 142*a* may have a magnetization direction perpendicular to the upper surface of the substrate 110. The first lower fixed layer 142*a* may be formed to be deposited on an upper surface of the seed layer. The magnetization direction of the first lower fixed layer 142*a* may be fixed without being influenced by an external magnetic field. The magnetization direction of the first lower fixed layer 142*a* may be fixed without being influenced by the magnetic field formed between the first upper electrode 146 and the first lower electrode 141.

The first exchange fixed layer 142*b* may be formed as a synthetic anti-ferromagnetic (SAF) layer. The first exchange fixed layer 142*b* may include an anti-ferromagnetic metal such as ruthenium (Ru), iridium (Ir), or rhodium (Rh). The first exchange fixed layer 142*b* may be formed to be deposited on an upper surface of the first lower fixed layer 142*a*.

The first upper fixed layer 142*c* may include CoFeB, CoFeTa, CoFeTb, CoFeDy, CoFeGd, CoFePt, CoFe, CoPt, or FeB. The first upper fixed layer 142*c* may be formed as a single layer or a multilayer. The first upper fixed layer 142*c* may include a cobalt-iron-boron (CoFeB) layer/a tantalum (Ta) layer/a cobalt-iron-boron (CoFeB) layer. The first upper fixed layer 142*c* may be formed to have a multi-layered structure including a cobalt (Co) layer/a boron (B) layer/a cobalt-iron-boron (CoFeB) layer or a cobalt (Co) layer/a tungsten (W) layer/a cobalt-iron-boron (CoFeB) layer/a tungsten (W) layer/a cobalt-iron-boron (CoFeB) layer. The first upper fixed layer 142*c* may be formed to be deposited on an upper surface of the first exchange fixed layer 142*b*. The first upper fixed layer 142*c* may have a magnetization direction perpendicular to the upper surface of the substrate 110. The magnetization direction of the first upper fixed layer 142*c* may be fixed without being influenced by an external magnetic field. The magnetization direction of the first upper fixed layer 142*c* may be fixed without being influenced by the magnetic field formed between the first upper electrode 146 and the first lower electrode 141.

The first tunnel barrier layer 143 may include a magnesium (Mg) oxide film. The first tunnel barrier layer 143 may include a titanium (Ti) oxide film, an aluminum (Al) oxide film, a magnesium-zinc (Mg—Zn) oxide film, or a magnesium-boron (Mg—B) oxide film. The first tunnel barrier layer 143 may be formed by depositing a metal and then oxidizing the metal. For example, the first tunnel barrier layer 143 may be formed by depositing and then oxidizing magnesium (Mg) on an upper surface of the first upper fixed layer 142*c*. The first tunnel barrier layer 143 may be located between the first fixed layer 142 having ferromagnetism and the first free layer 144. When a voltage is applied in a direction perpendicular to a bonding surface of the first tunnel barrier layer 143 to each of the first fixed layer 142 and the first free layer 144, a current may flow through the MTJ due to a tunnel effect. A resistance value of the MTJ may be lowered when spin polarization of the first fixed layer 142 has the same direction as that of the first free layer 144, and may be increased when the spin polarization of the first fixed layer 142 has an opposite direction to that of the first free layer 144.

The first free layer 144 may include CoFeB, FeB, CoFe, or Co$_2$FeSi. The first free layer 144 may be formed as a single layer or a multilayer. For example, the first free layer 144 may be formed as a single layer of a cobalt-iron-boron (CoFeB) layer. The first free layer 144 may be formed as a multilayer including a cobalt-iron-boron (CoFeB) layer/a tungsten (W) layer/a cobalt-iron-boron (CoFeB) layer. The first free layer 144 may be formed to be deposited on an upper surface of the first tunnel barrier layer 143. The first free layer 144 may have a magnetization direction perpendicular to the upper surface of the substrate 110. The magnetization direction of the first free layer 144 may be changed. For example, the magnetization direction of the first free layer 144 may be changed by influence of the magnetic field formed between the first upper electrode 146 and the first lower electrode 141.

The first capping layer 145 may include tantalum (Ta), magnesium (Mg), or titanium (Ti). The first capping layer 145 may include copper (Cu), aluminum (Al), or ruthenium (Ru). The first capping layer 145 may be formed with a metal oxide film by an oxidation process after a metal film is deposited by a sputtering process. The first capping layer 145 may be formed on an upper surface of the first free layer 144 to have a first capping thickness t1. The first capping thickness t1 may range from 0.7 nm to 1.5 nm. The first capping thickness t1 of the first capping layer 145 may be adjusted by adjusting a thickness of a sputtered metal. The first capping thickness t1 may affect energy required to change the magnetization direction of the first free layer 144 included in the MTJ. When the first capping thickness t1 is thick, the energy required to change the magnetization direction of the MTJ is reduced, and thus the operating speed thereof may be increased and the retention characteristic thereof may be reduced. When the first capping thickness t1 is thin, the energy required to change the magnetization direction of the MTJ is increased, and thus the operating speed thereof may be reduced and the retention characteristic thereof may be increased. The first capping thickness t1 of the first capping layer 145 may be formed to be relatively thick. In this case, the operating speed of the first magnetoresistive cell may be relatively high, and the retention characteristic thereof may be low.

The first upper electrode 146 may be formed of a conductor such as a metal material or a metal silicide. The first upper electrode 146 may be formed to be deposited on an upper surface of the first capping layer 145.

The second memory device 150 includes a second lower electrode 151, a second fixed layer 152, a second tunnel barrier layer 153, a second free layer 154, a second capping layer 155, and a second upper electrode 156. The second memory device 150 in plural may be formed in the second memory area 100b. The second fixed layer 152, the second tunnel barrier layer 153, the second free layer 154, and the second capping layer 155 of the second memory device 150 may form a second magnetoresistive cell of the second memory device 150. The second magnetoresistive cell may be electrically connected to the second lower electrode 151. The second magnetoresistive cell may be electrically connected to the second upper electrode 156. In the second magnetoresistive cell, additional layers may be formed between the second fixed layer 152, the second tunnel barrier layer 153, the second free layer 154, and the second capping layer 155.

The second memory device 150 may be formed to have the same stacked structure as the first memory device 140, and may be simultaneously formed with the first memory device 140 by one process. The second lower electrode 151, the second fixed layer 152, the second tunnel barrier layer 153, the second free layer 154, the second capping layer 155, and the second upper electrode 156 of the second memory device 150 may be formed of the same materials as the first lower electrode 141, the first fixed layer 142, the first tunnel barrier layer 143, the first free layer 144, the first capping layer 145, and the first upper electrode 146 of the first memory device 140. The second memory device 150 may be formed to have the same stacked structure as the first memory device 140. Therefore, detailed descriptions of the second lower electrode 151, the second fixed layer 152, the second tunnel barrier layer 153, the second free layer 154, the second capping layer 155, and the second upper electrode 156 of the second memory device 150 will be omitted.

However, at least one deposition layer included in the second magnetoresistive cell of the second memory device 150 may be formed to have a thickness different from that of the corresponding deposition layer of the first magnetoresistive cell of the first memory device 140. A thickness of any one deposition layer of the second magnetoresistive cell may be thinner than a thickness of a corresponding deposition layer of the first magnetoresistive cell. For example, the second capping layer 155 with a second capping thickness is thinner than the first capping layer 145 with the first capping thickness t1. The second capping thickness t2 of the second capping layer 155 may range from 0.1 nm to 0.7 nm. The second capping thickness t2 of the second capping layer 155 may be relatively thinner than the first capping thickness t1 of the first capping layer 145. In this case, an operating speed of the second magnetoresistive cell may be low, and a retention characteristic thereof may be high.

Figure 3:
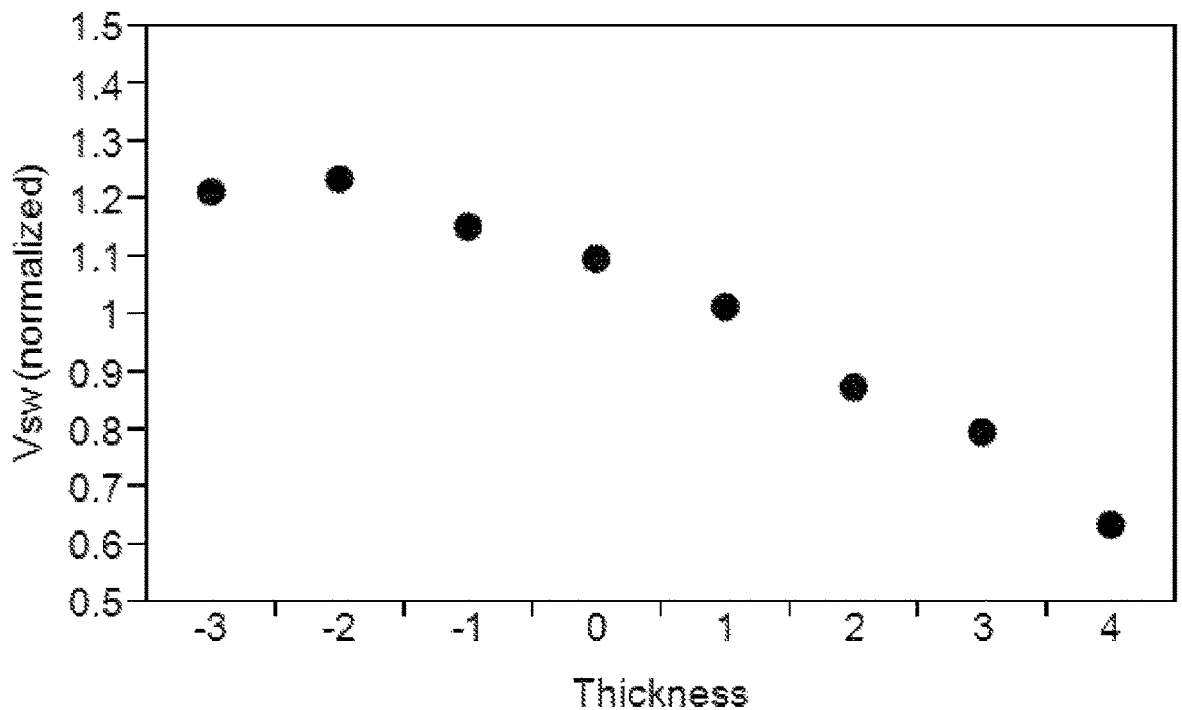
FIG. 3 is a graph illustrating a switching voltage (Vsw) measured according to a thickness of a capping layer of each of the memory devices constituting the semiconductor memory device according to the exemplary embodiment of the present inventive concept.
Figure 4:
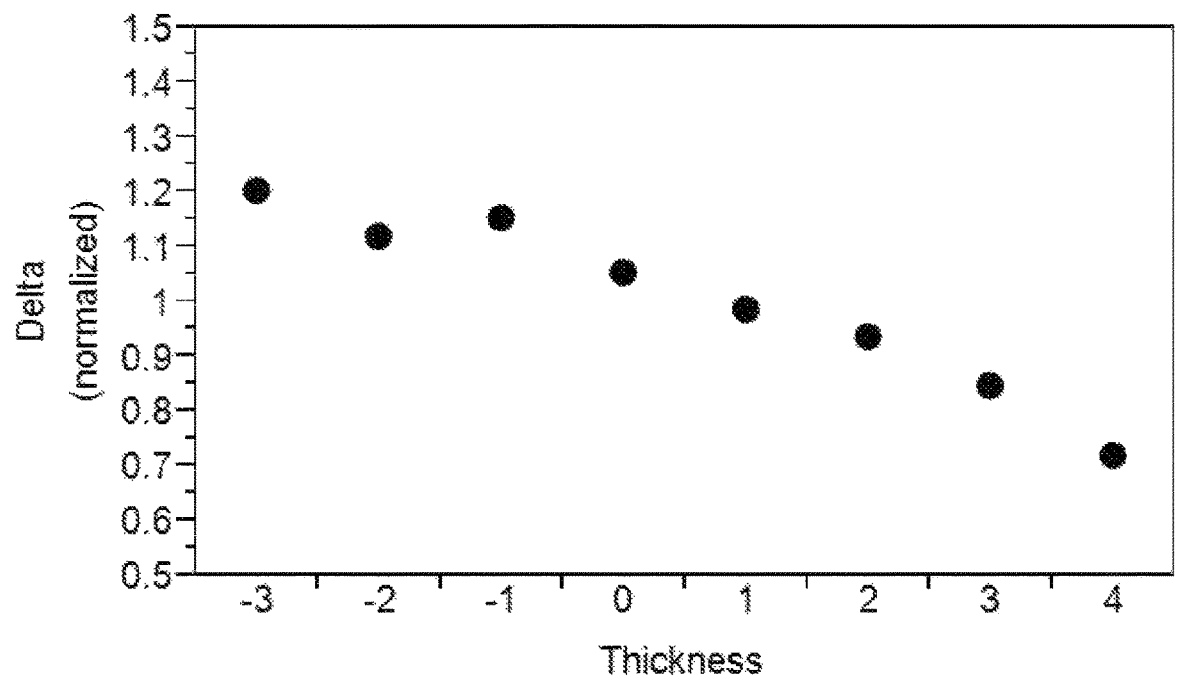
FIG. 4 is a graph illustrating thermal stability measured according to the thickness of the capping layer of each of the memory devices constituting the semiconductor memory device according to the exemplary embodiment of the present inventive concept.

FIG. 3 is a graph illustrating a switching voltage Vsw measured according to a thickness of a capping layer of each of the memory devices constituting the semiconductor memory device according to the exemplary embodiment of the present inventive concept. In FIG. 3, an X-axis represents a thickness of the capping layer, and the thickness of the capping layer is increased in a right direction. The switching voltage Vsw of a memory device is reduced as the thickness of the capping layer is increased, and is increased as the thickness of the capping layer is reduced. FIG. 4 is a graph illustrating thermal stability measured according to the thickness of the capping layer of each of the memory devices constituting the semiconductor memory device according to the exemplary embodiment of the present inventive concept. In FIG. 4, an X-axis represents a thickness of the capping layer, and the thickness of the capping layer is increased in the right direction. The thermal stability in a memory device is reduced as the thickness of the capping layer is increased, and is increased as the thickness of the capping layer is reduced. Thermal stability may affect a retention characteristic of the memory device.

Therefore, when the thickness of the capping layer is thicker, the memory device may have characteristics like an SRAM of which an operating speed or a switching speed is increased and a retention characteristic is reduced. Further, when the thickness of the capping layer is thinner, the memory device may have characteristics like a flash memory of which an operating speed is reduced and a retention characteristic is increased.

Referring back to FIG. 2, the upper insulating layer 160 is formed on the lower insulating layer 120 to surround the first memory device 140 and the second memory device 150. The upper insulating layer 160 may be formed of silicon oxide.

The upper contact plugs 170 vertically pass through the upper insulating layer 160, and thus lower ends of the upper contact plugs 170 are be in contact with the first memory device 140 and the second memory device 150. For example, the upper contact plugs 170 may be electrically connected to the first memory device 140 and the second memory device 150. The upper contact plugs 170 may be electrically connected to the first upper electrode 146 and the second upper electrode 156, and upper ends of the upper contact plugs 170 may be exposed at an upper surface of the upper insulating layer 160. The upper contact plugs 170 may be formed of a conductor such as polysilicon, a metal material, and a metal silicide. On the other hand, when the first upper electrode 146 or the second upper electrode 156 is in contact with the bit line 180, the upper contact plug 170 may be omitted.

The bit line 180 is formed on the upper surface of the upper insulating layer 160, and connected to the upper contact plugs 170. The bit line 180 may be formed of a conductor such as polysilicon, a metal material, and a metal silicide.

Next, semiconductor memory devices according to exemplary embodiments of the present inventive concept will be described.

Hereinafter, the same reference numerals are assigned to the same components of the semiconductor memory devices according to the exemplary embodiments of the present inventive concept as those of the semiconductor memory device according to an exemplary embodiment of the present inventive concept, detailed descriptions thereof will be omitted, and different components therefrom will be mainly described.

Figure 5:
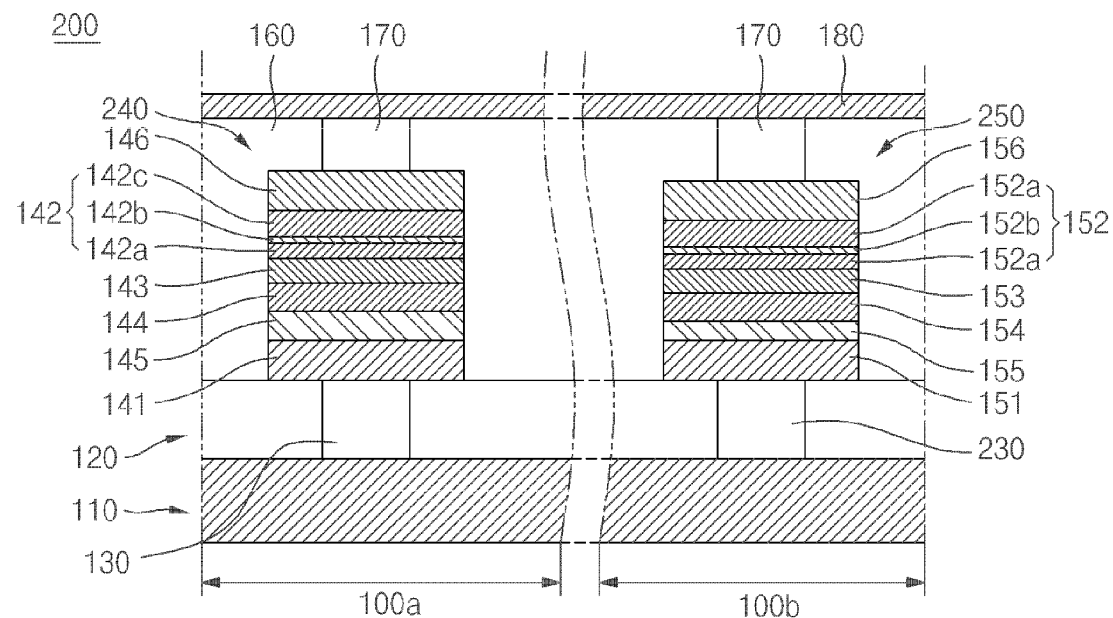
FIG. 5 is a longitudinal sectional view of a semiconductor memory device according to an exemplary embodiment of the present inventive concept.

FIG. 5 is a longitudinal sectional view of a semiconductor memory device according to an exemplary embodiment of the present inventive concept.

Referring to FIG. 5, a semiconductor memory device 200 includes a substrate 110, a lower insulating layer 120, lower contact plugs 130, a first memory device 240, a second memory device 250, an upper insulating layer 160, and upper contact plugs 170. The semiconductor memory device 200 further includes a bit line 180.

A first magnetoresistive cell of the first memory device 240 has a reversed stacked structure from that of the first magnetoresistive cell of FIGS. 1 and 2. For example, the first memory device 240 has a structure in which a first capping layer 145, a first free layer 144, a first tunnel barrier layer 143, and a first fixed layer 142 are sequentially stacked from the substrate 110. Further, a second magnetoresistive cell of the second memory device 150 has a reversed stacked structure from that of the second magnetoresistive cell of FIGS. 1 and 2. For example, the second memory device 250 has a structure in which a second capping layer 155, a second free layer 154, a second tunnel barrier layer 153, and a second fixed layer 152 are sequentially stacked from the substrate 110.

Figure 6:
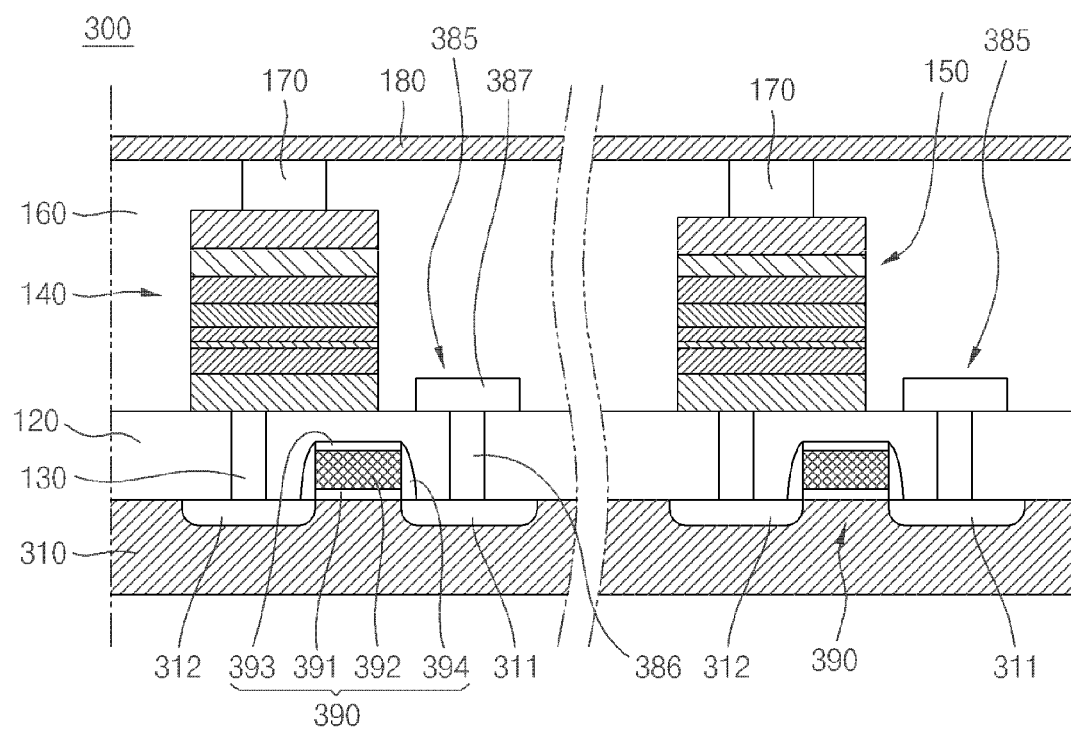
FIG. 6 is a longitudinal sectional view of a semiconductor memory device according to an exemplary embodiment of the present inventive concept.

FIG. 6 is a longitudinal sectional view of a semiconductor memory device according to an exemplary embodiment of the present inventive concept.

Referring to FIG. 6, a semiconductor memory device 300 includes a substrate 310, a lower insulating layer 120, lower contact plugs 130, a switching device 390, a first memory device 140, a second memory device 150, an upper insulating layer 160, and upper contact plugs 170. The semiconductor memory device 300 further includes a bit line 180 and word lines 385.

The substrate 310 includes a source area 311 and a drain area 312. The source area 311 and the drain area 312 are spaced a predetermined distance from each other. The source area 311 and the drain area 312 may be formed by doping with a dopant such as boron, phosphorus, or arsenic. The word line 385 may be electrically connected to the source area 311. The lower contact plug 130 may be electrically connected to the drain area 312.

The switching device 390 may be formed to have a gate structure. The switching device 390 includes a gate insulating layer 391, a gate electrode 392, a gate capping layer 393, and a gate spacer 394. The switching device 390 is located between the source area 311 and the drain area 312 on an upper surface of the substrate 310.

The gate insulating layer 391 may include silicon oxide, silicon nitride, or a high dielectric. The gate insulating layer 391 is formed between the source area 311 and the drain area 312 on the upper surface of the substrate 310. The gate electrode 392 may include a conductor such as polysilicon doped with an impurity, a metal, a metal alloy, or a metal silicide. The gate electrode 392 is formed on an upper surface of the gate insulating layer 391. The gate capping layer 393 may include an insulator such as silicon oxide or silicon nitride. The gate capping layer 393 is formed on an upper surface of the gate electrode 392. The gate spacer 394 may be formed of silicon nitride or silicon oxide. The gate spacer 394 covers side surfaces of the gate insulating layer 391, the gate electrode 392, and the gate capping layer 393. The gate spacer 394 also covers a portion of an upper surface of each of the source area 311 and the drain area 312 which are located at both sides of the gate insulating layer 391.

The word line 385 includes a word contact plug 386 and a word electrode 387. The word contact plug 386 vertically passes through the lower insulating layer 120 to be in contact with the source area 311. An upper end of the word contact plug 386 is exposed at an upper surface of the lower insulating layer 120. The word contact plug 386 may be formed of the same material as the lower contact plug 130. The word electrode 387 may be electrically connected to the word contact plug 386 on the upper surface of the lower insulating layer 120. The word electrode 387 may extend in a lateral direction. The word electrode 387 may include polysilicon, a metal, a metal alloy, or a metal silicide.

Figure 7:
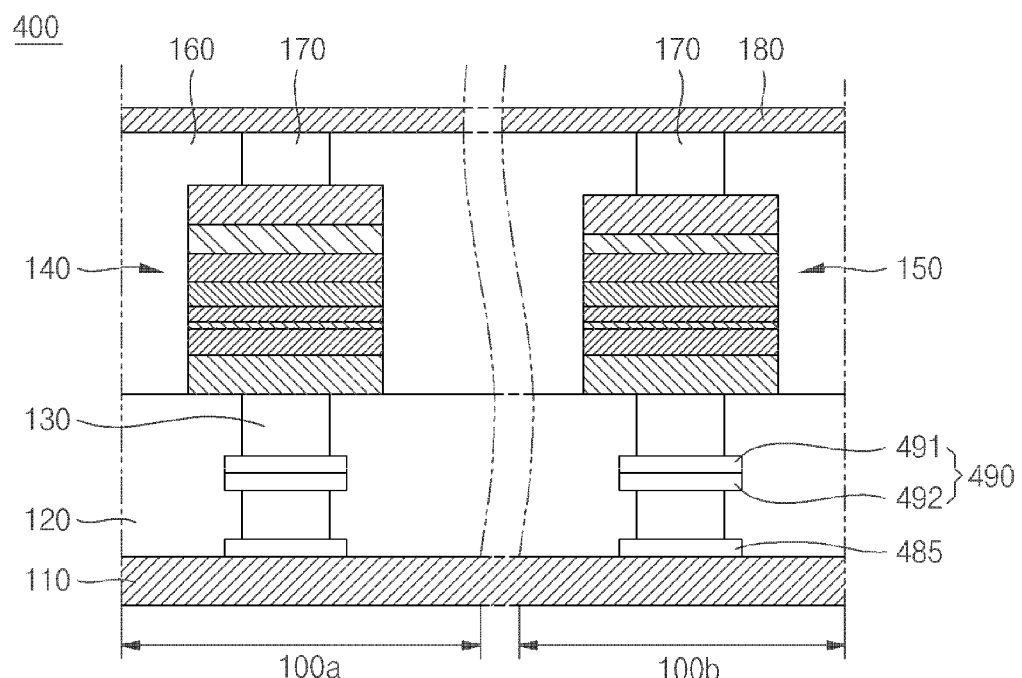
FIG. 7 is a longitudinal sectional view of a semiconductor memory device according to an exemplary embodiment of the present inventive concept.

FIG. 7 is a longitudinal sectional view of a semiconductor memory device according to an exemplary embodiment of the present inventive concept.

Referring to FIG. 7, a semiconductor memory device 400 includes a substrate 110, a lower insulating layer 120, lower contact plugs 130, a switching device 490, a first memory device 140, a second memory device 150, an upper insulating layer 160, and upper contact plugs 170. The semiconductor memory device 400 further includes a bit line 180 and a word line 485.

The switching device 490 may include a diode. For example, the switching device 490 includes an anode 491 and a cathode 492. The switching device 490 may be coupled to a middle portion of the lower contact plug 130.

The word line 485 may include a word electrode. The word line 485 is located between the substrate 110 and the lower contact plug 130. An upper surface of the word line 485 is in contact with the lower contact plug 130, and a lower surface thereof may be in contact with the substrate 110. The word line 485 is located on an upper surface of the substrate 110. The present inventive concept is not limited thereto. For example, the word line 485 may be embedded in the substrate 110. The word line 485 may extend in a lateral direction. The word line 485 may include polysilicon, a metal, a metal alloy, or a metal silicide.

Next, a process of manufacturing a semiconductor memory device according to an exemplary embodiment of the present inventive concept will be described.

FIGS. 8A to 8I are longitudinal sectional views for describing a process of manufacturing a semiconductor memory device according to an exemplary embodiment of the present inventive concept.

Hereinafter, a case in which a thickness of a first capping layer 145 is different from that of a second capping layer 155 in the semiconductor memory device according to the exemplary embodiment of the present inventive concept will be mainly described. The following processes may be applied even when a thickness of a first fixed layer 142 is different from that of a second fixed layer 152, even when a thickness of a first tunnel barrier layer 143 is different from that of a second tunnel barrier layer 153, or even when a thickness of a first free layer 144 is different from that of a second free layer 154.

Figure 8A:
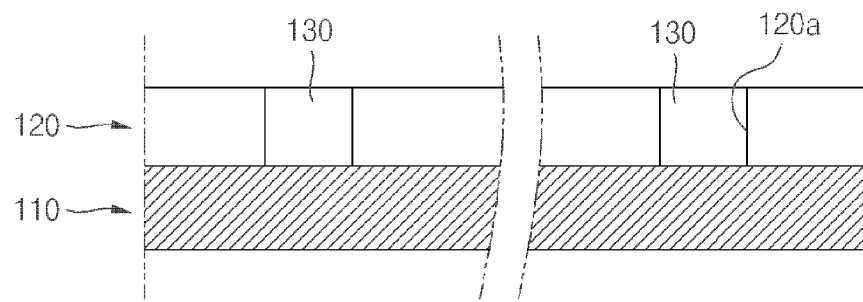
FIGS. 8A to 8I are longitudinal sectional views for describing a process of manufacturing a semiconductor memory device according to an exemplary embodiment of the present inventive concept.

Referring to FIG. 8A, a lower insulating layer 120 is formed on an upper surface of a substrate 110 to have a predetermined thickness. The lower insulating layer 120 may be formed as a single layer or a multilayer. A lower through hole 120a is formed in the lower insulating layer 120 to vertically pass therethrough. A lower contact plug 130 is formed in the lower through hole 120a. A lower end of the lower contact plug 130 is connected to the substrate 110, and an upper end thereof is exposed at an upper surface of the lower insulating layer 120. The substrate 110 may be formed with a silicon wafer. The lower insulating layer 120 may be formed of silicon oxide. The lower contact plug 130 may be formed of doped silicon, polysilicon, a metal, or a metal alloy.

Figure 8B:
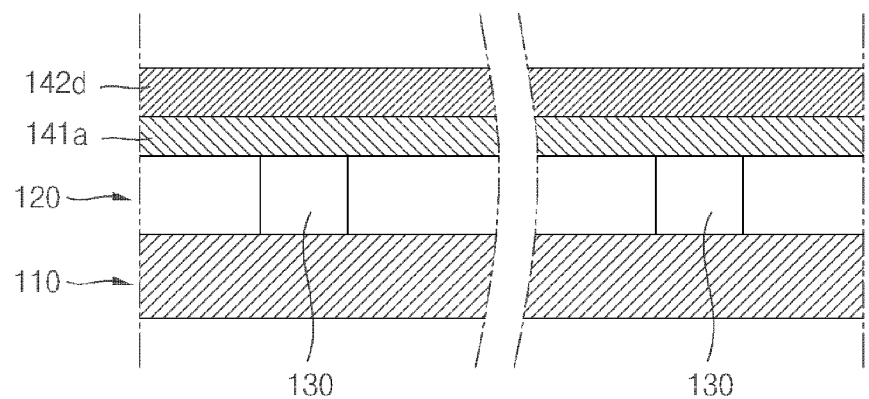

Referring to FIG. 8B, a lower electrode film 141*a* and a fixed film 142*d* are formed on the upper surface of the lower insulating layer 120. The lower electrode film 141*a* may be simultaneously formed in a first memory area 100*a* and a second memory area 100*b* by one process. The fixed film 142*d* may be simultaneously formed in the first memory area 100*a* and the second memory area 100*b* by one process. The fixed film 142*d* may be formed with three layers, but is illustrated herein as one layer. The lower electrode film 141*a* may be formed to have the same thickness in the first memory area 100*a* and the second memory area 100*b*. The fixed film 142*d* may be formed to have the same thickness in the first memory area 100*a* and the second memory area 100*b*. The lower electrode film 141*a* may be formed of a conductive metal nitride such as titanium nitride or tantalum nitride. The lower electrode film 141*a* may be formed by a sputtering process. The fixed film 142*d* may be formed of CoFeB. The fixed film 142*d* may be formed by a sputtering process.

Figure 8C:
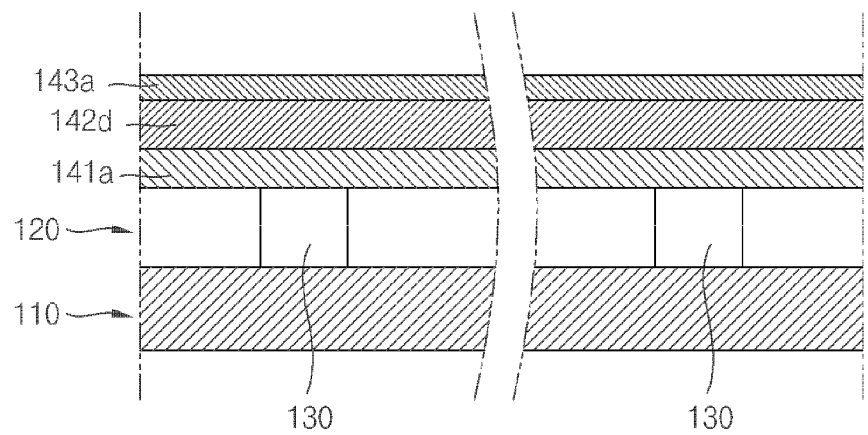

Referring to FIG. 8C, a tunnel barrier film 143*a* is formed on an upper surface of the fixed film 142*d*. The tunnel barrier film 143*a* may be simultaneously formed in the first memory area 100*a* and the second memory area 100*b* by one process. The tunnel barrier film 143*a* may be formed with a magnesium oxide film. The tunnel barrier film 143*a* may be formed by oxidizing a magnesium metal layer deposited on the upper surface of the fixed film 142*d*. The tunnel barrier film 143*a* may be formed to have the same thickness in the first memory area 100*a* and the second memory area 100*b*. The tunnel barrier film 143*a* may be formed by a sputtering process.

Figure 8D:
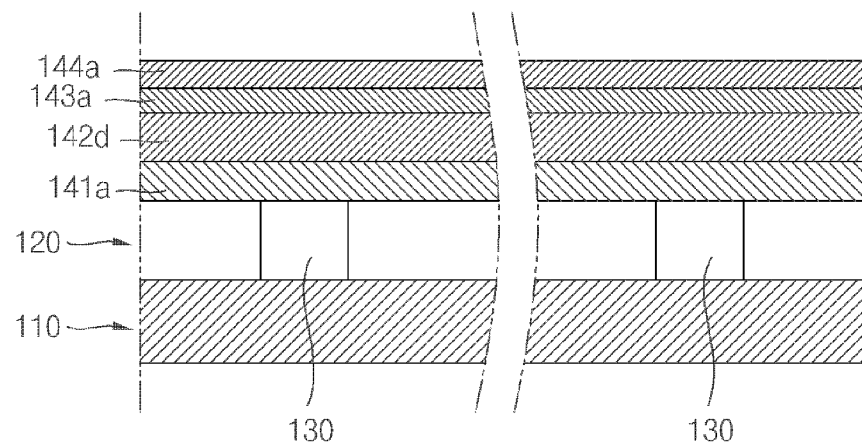

Referring to FIG. 8D, a free film 144*a* is formed on an upper surface of the tunnel barrier film 143*a*. The free film 144*a* may be simultaneously formed in the first memory area 100*a* and the second memory area 100*b* by one process. The free film 144*a* may be formed to have the same thickness in the first memory area 100*a* and the second memory area 100*b*. The free film 144*a* may be formed of CoFeB. The free film 144*a* may be formed by a sputtering process.

Figure 8E:
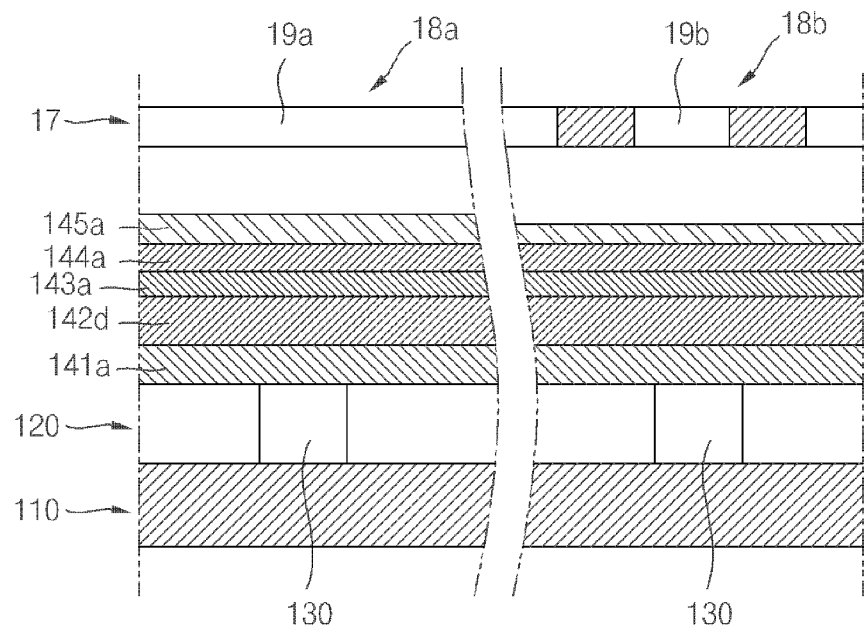

Referring to FIG. 8E, a capping film 145*a* is formed on an upper surface of the free film 144*a*. The capping film 145*a* may be simultaneously formed in the first memory area 100*a* and the second memory area 100*b* by one process. The capping film 145*a* may be formed by a sputtering process. The capping film 145*a* is formed to have different thicknesses in the first memory area 100*a* and the second memory area 100*b*. To this end, a shielding plate 17 (see FIGS. 11A to 11C) may be located above the free film 144*a* during the sputtering process. The shielding plate 17 may include a first exposure area 18*a* located above the first memory area 100*a* and a second exposure area 18*b* located above the second memory area 100*b*. A first exposure hole 19*a* may be entirely formed in the first exposure area 18*a*, and a plurality of second exposure holes 19*b* having a predetermined size may be formed in the second exposure area 18*b* to have a grid shape or a stripe shape. Since the entire upper surface of the free film 144*a* is exposed by the first exposure hole 19*a* in the first memory area 100*a*, sputtered particles may directly reach the upper surface of the free film 144*a*. Since the upper surface of the free film 154*a* is partially shielded by the second exposure holes 19*b* in the second memory area 100*b*, some sputtered particles may be blocked. Therefore, an amount of the sputtered particles deposited on the upper surface of the free film 154*a* in the second memory area 100*b* may be reduced and the free film 154*a* in the second memory area 100*b* may be formed to have a relatively thin thickness. A thickness of the capping film 145*a* in the first memory area 100*a* may be thicker than that of the capping film 145*a* in the second memory area 100*b*.

Figure 8F:
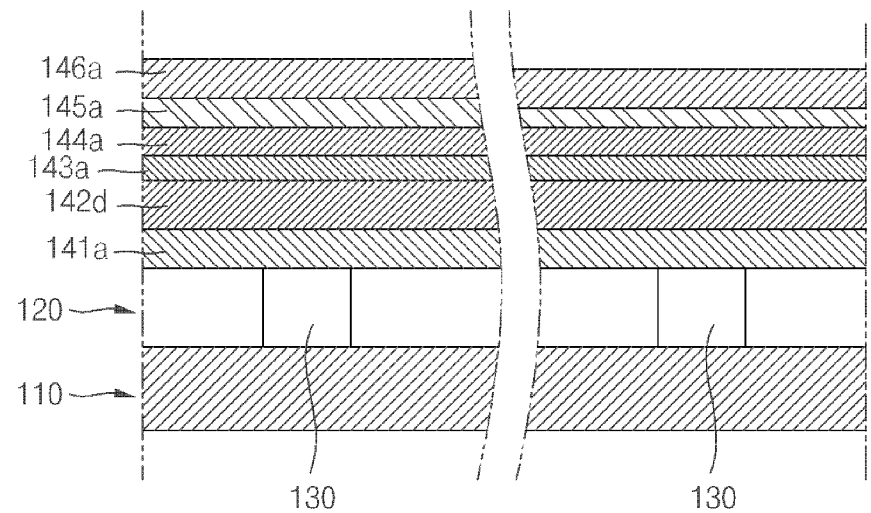

Referring to FIG. 8F, an upper electrode film 146*a* is formed on an upper surface of the capping film 145*a*. The upper electrode film 146*a* may be simultaneously formed in the first memory area 100*a* and the second memory area 100*b* by one process. The upper electrode film 146*a* may be formed to have the same thickness in the first memory area 100*a* and the second memory area 100*b*.

Figure 8G:
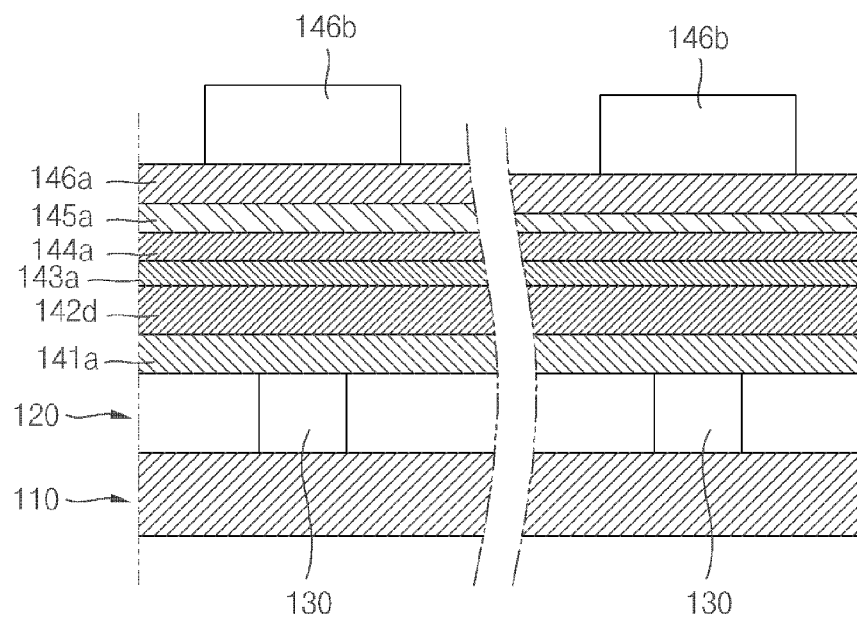

Referring to FIG. 8G, in each of the first memory area 100*a* and the second memory area 100*b*, a hard mask 146*b* is formed on the upper electrode film 146*a*. The hard mask 146*b* may be formed of a metal. The hard mask 146*b* may be formed to have an area corresponding to a plane area of each of a first magnetoresistive cell and a second magnetoresistive cell.

Figure 8H:
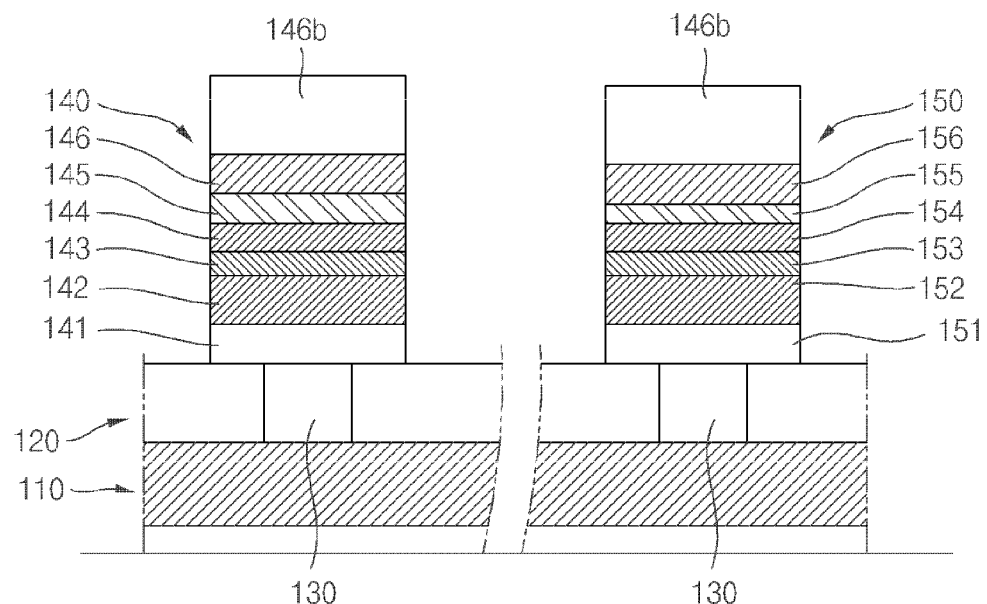

Referring to FIG. 8H, a first memory device 140 and a second memory device 150 may be formed by etching the lower electrode film 141*a*, the fixed film 142*d*, the tunnel barrier film 143*a*, the free film 144*a*, the capping film 145*a*, and the upper electrode film 146*a* using the hard mask 146*b* as an etch mask. The first memory device 140 is formed in the first memory area 100*a*, and the second memory device 150 is formed in the second memory area 100*b*.

Figure 8I:
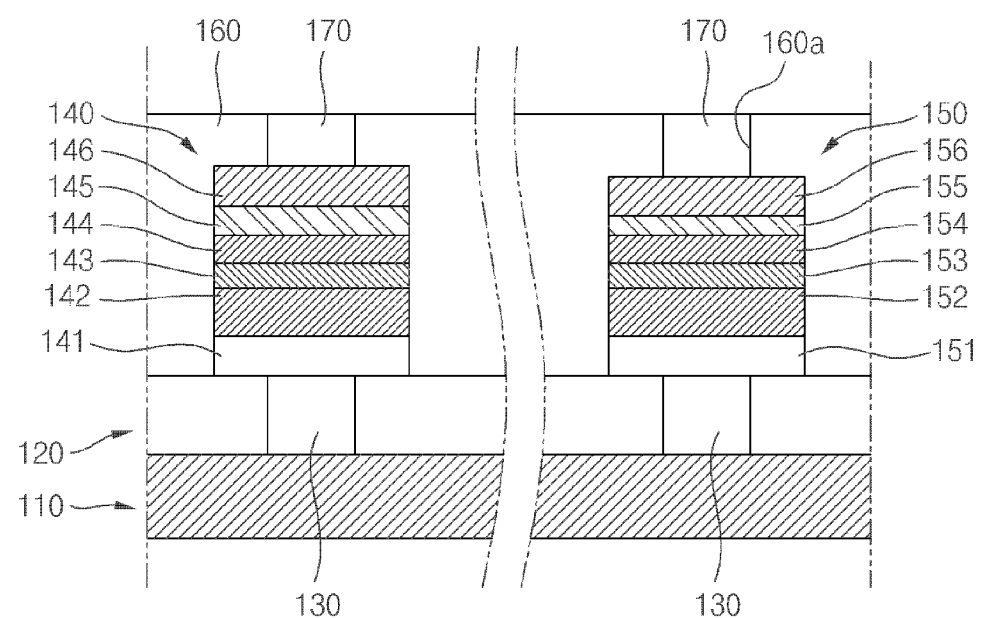

Referring to FIG. 8I, an upper insulating layer 160 is formed to cover the first memory device 140 and the second memory device 150. The upper insulating layer 160 covers the upper surface of the lower insulating layer 120 and side surfaces and an upper surface of each of the first memory device 140 and the second memory device 150. An upper through hole 160*a* is formed in the upper insulating layer 160 to vertically pass therethrough. An upper contact plug 170 is formed in the upper through hole 160*a*. A lower end of the upper contact plug 170 is connected to a first upper electrode 146 or a second upper electrode 156, and an upper end thereof is exposed at an upper surface of the upper insulating layer 160. The upper insulating layer 160 may be formed of silicon oxide. The upper contact plug 170 may be formed of polysilicon, a metal, or a metal alloy. A bit line 180 is formed on the upper surface of the upper insulating layer 160 to be electrically connected to the upper contact plug 170.

Next, a semiconductor memory manufacturing apparatus according to an exemplary embodiment of the present inventive concept will be described.

Figure 9:
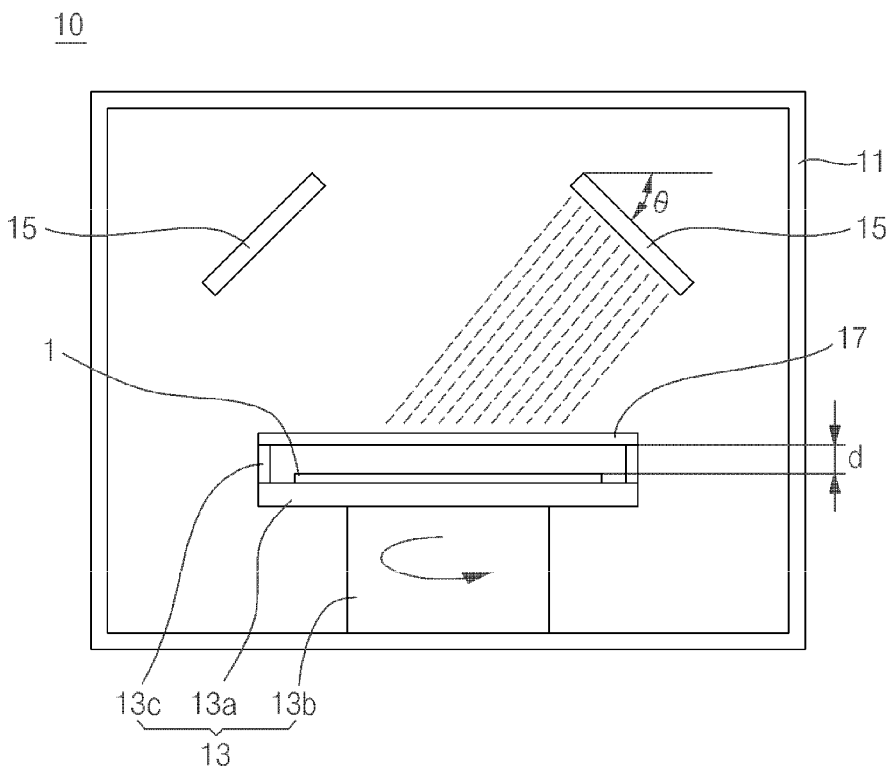
FIG. 9 is a longitudinal sectional view of a semiconductor memory manufacturing apparatus according to an exemplary embodiment of the present inventive concept.
Figure 10:
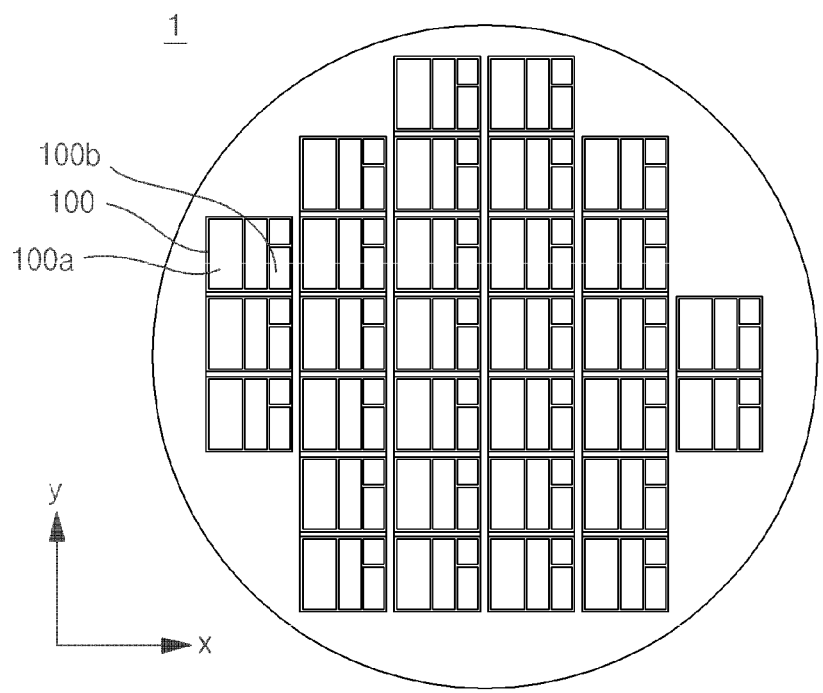
FIG. 10 is a plan view of a semiconductor wafer deposited by the semiconductor memory manufacturing apparatus according to the exemplary embodiment of the present inventive concept.
Figure 11A:
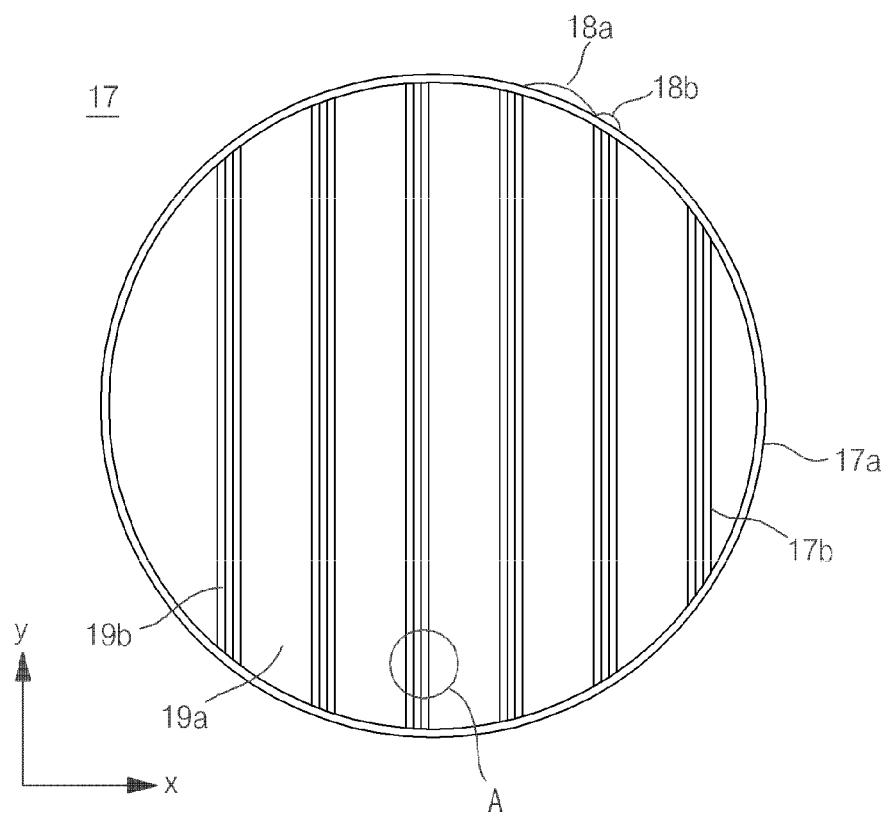
FIG. 11A is a plan view of a shielding plate of FIG. 9.
Figure 11B:
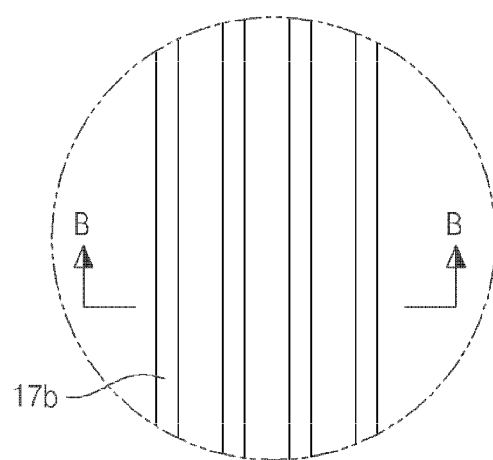
FIG. 11B is an enlarged view of area A of FIG. 11A.
Figure 11C:
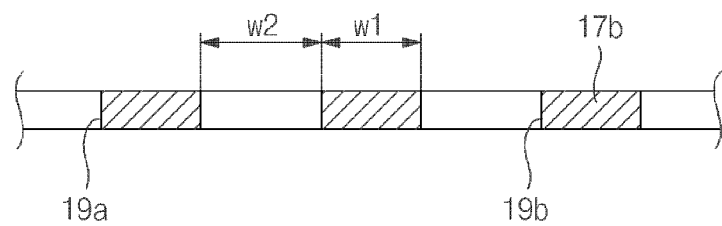
FIG. 11C is a longitudinal sectional view taken along line B-B of FIG. 11B.
Figure 12:
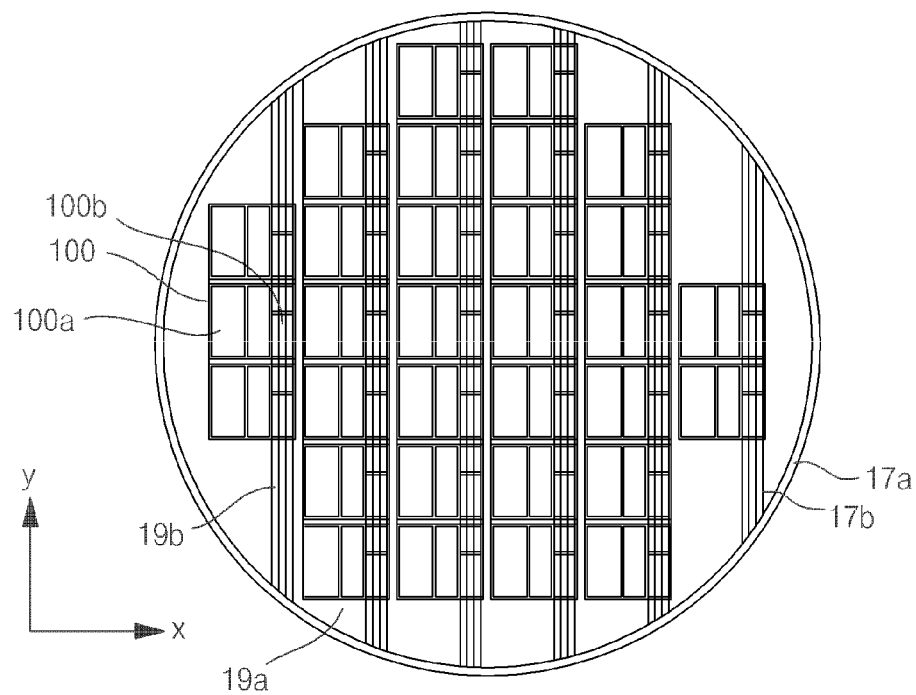
FIG. 12 is a top view illustrating a shielding plate after the semiconductor wafer of FIG. 10 is mounted on a wafer holder.
Figure 13A:
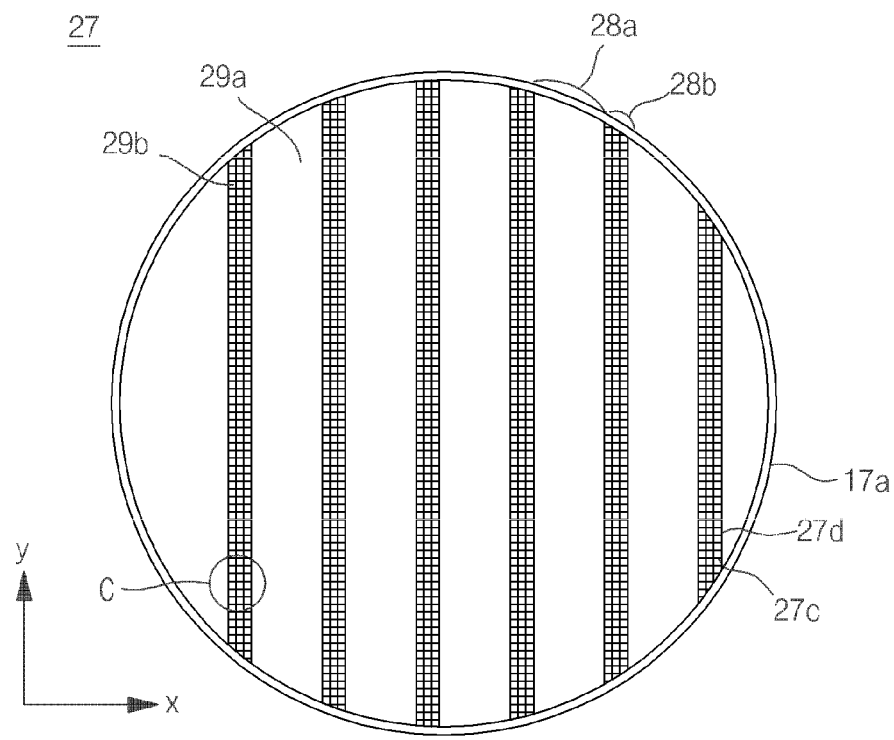
FIG. 13A is a plan view of a shielding plate according to an exemplary embodiment of the present inventive concept.
Figure 13B:
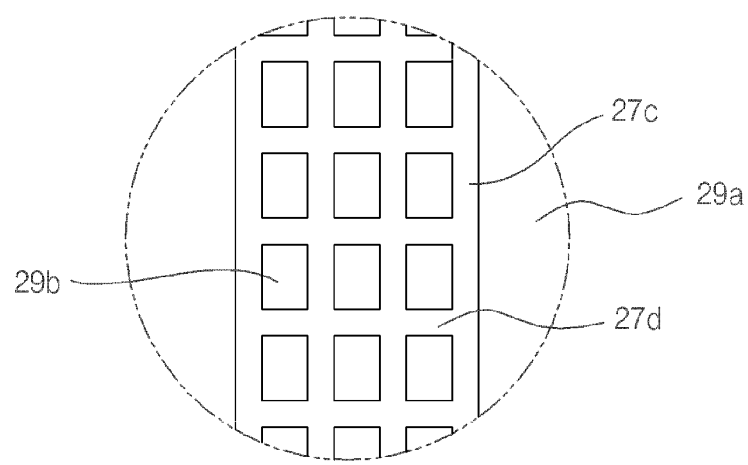
FIG. 13B is an enlarged view of area C of FIG. 13A.
Figure 14:
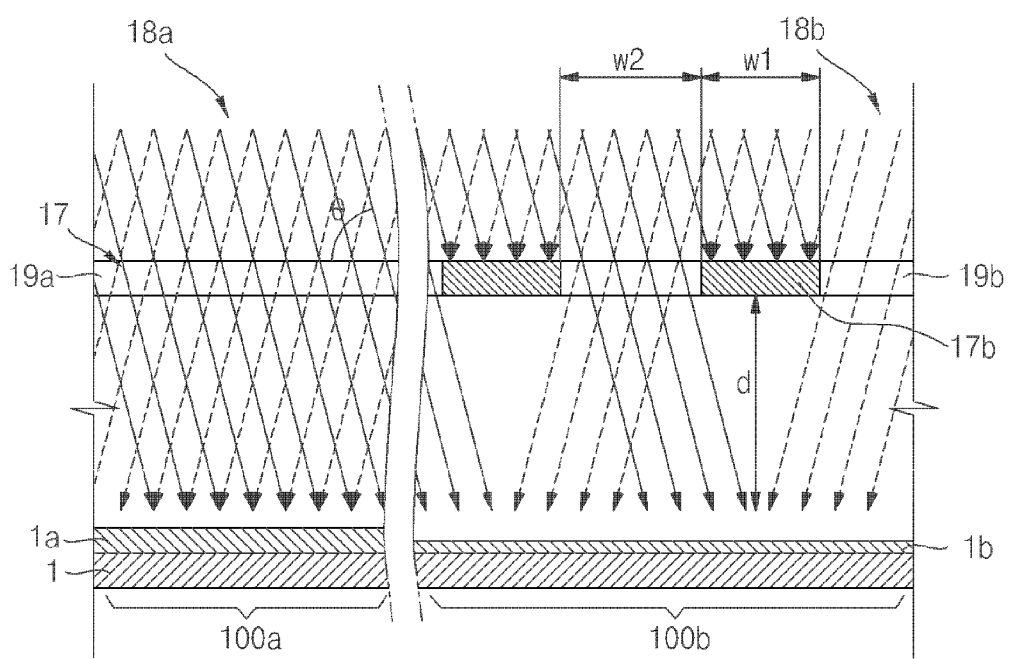
FIG. 14 is a partial longitudinal sectional view illustrating an operation of the shielding plate of the semiconductor memory manufacturing apparatus of FIG. 9.

FIG. 9 is a longitudinal sectional view of a semiconductor memory manufacturing apparatus according to an exemplary embodiment of the present inventive concept. FIG. 10 is a plan view of a semiconductor wafer deposited by the semiconductor memory manufacturing apparatus according to an exemplary embodiment of the present inventive concept. FIG. 11A is a plan view of a shielding plate of FIG. 9, FIG. 11B is an enlarged view of area A of FIG. 11A, and FIG. 11C is a longitudinal sectional view taken along line B-B of FIG. 11B. FIG. 12 is a top view illustrating a shielding plate after the semiconductor wafer of FIG. 10 is mounted on a wafer holder. FIG. 13A is a plan view of a shielding plate according to an exemplary embodiment of the present inventive concept, and FIG. 13B is an enlarged view of area C of FIG. 13A. FIG. 14 is a partial longitudinal sectional view illustrating an operation of the shielding plate of the semiconductor memory manufacturing apparatus of FIG. 9.

Referring to FIGS. 9 to 12, a semiconductor memory manufacturing apparatus 10 includes a process chamber 11, a wafer holder 13, sputtering target holders 15, and a shielding plate 17.

The semiconductor memory manufacturing apparatus 10 may be used for manufacturing a semiconductor memory device including a magnetoresistive cell. The semiconductor memory manufacturing apparatus 10 may be used for depositing any deposition layer of magnetoresistive cells (or MTJs), which are located in different areas in one semiconductor memory device (or one semiconductor memory chip), to simultaneously have different thicknesses in the different areas. The semiconductor memory manufacturing apparatus 10 may form any deposition layer of magnetoresistive cells, which are located at different areas, to simultaneously have different thicknesses in the different areas by one process. Meanwhile, the semiconductor memory manufacturing apparatus 10 may be used in a process of locally depositing a deposition layer having a relatively small thickness to have a different thickness in addition to the semiconductor memory device including the magnetoresistive cell.

Referring to FIG. 10, in a semiconductor wafer 1 used in the semiconductor memory manufacturing apparatus 10, a plurality of semiconductor memory devices 100, which are arranged in a first direction y and spaced apart from each other in a second direction x, may be formed. Each of the semiconductor memory devices 100 may include a first memory area 100a and a second memory area 100b. The first memory area 100a in plural may be arranged in a straight line in the first direction y, and the second memory area 100b in plural may be spaced apart from the first memory areas 100a in the second direction x and arranged in a straight line in the first direction y. The first memory area 100a in plural may be spaced apart from each other in the second direction x while forming a rectangular shape which extends in the first direction y in the semiconductor wafer 1. The second memory area 100b in plural may be alternately located with the first memory areas 100a while forming a rectangular shape which extends in the first direction y in the semiconductor wafer 1.

The process chamber 11 has a hollow inside to accommodate the wafer holder 13, the sputtering target holders 15, and the shielding plate 17. An inert gas, such as argon (Ar) gas, may be supplied into the process chamber 11. The process chamber 11 may be formed as a process chamber of a sputtering process.

The wafer holder 13 includes a holder body 13a, a body support 13b and a supporting bar 13c. The wafer holder 13 is located at a lower side of the inside of the process chamber 11 to support the semiconductor wafer 1 mounted on an upper surface thereof. The wafer holder 13 may be rotated by a separate rotating unit (not illustrated).

The holder body 13a is formed to have an area larger than an area of the semiconductor wafer 1. The holder body 13a may hold and support the semiconductor wafer 1 on the upper surface thereof.

The body support 13b is connected to a lower portion of the holder body 13a to support the holder body 13a. The body support 13b may adjust the height of the holder body 13a to a predetermined height inside the process chamber 11. For example, the holder body 13 may be raised or lowered by raising or lowering the body support 13b. The body support 13b may be connected to a separate rotating unit (not illustrated) and rotated, and thus the holder body 13a may be rotated.

The supporting bar 13c has a bar shape having a predetermined length. The supporting bar 13c is connected to the holder body 13a at an outer circumferential surface of the holder body 13a. The supporting bar 13c supports the shielding plate 17 located on the wafer holder 13.

A plurality of sputtering targets held by a plurality of sputtering target holders 15 are provided and spaced apart from each other in a circumferential direction with respect to the semiconductor wafer 1. The sputtering target holders 15 are located so that target surfaces thereof face the semiconductor wafer 1. Each of the sputtering target holders 15 is inclined at a predetermined inclination angle $\Theta$ with respect to a plane of the semiconductor wafer 1. The sputtering target holders 15 may hold sputtering targets for a sputtering process. The inclination angle $\Theta$ of each of the sputtering target holders 15 may be appropriately determined in consideration of a diameter of the semiconductor wafer 1, a distance between each of the sputtering target holders 15 and the semiconductor wafer 1, a thickness of a deposition layer to be formed, and the like. Therefore, sputtered particles generated by sputtering the sputtering targets held by the sputtering target holders 15 may be incident on an upper surface of the semiconductor wafer 1 in an inclined direction. The sputtering target may be formed of a material corresponding to any one of a plurality of deposition layers constituting a magnetoresistive cell of a semiconductor memory device. For example, the sputtering target may be formed of a material constituting a fixed layer, a tunnel barrier layer, or a free layer.

The shielding plate 17 includes a shielding frame 17a and shielding bars 17b. The shielding plate 17 includes a first exposure area 18a and a second exposure area 18b. The first exposure area 18a is an area in which one first exposure hole 19a is formed to vertically pass through the entire area, and the second exposure area 18b is an area in which a plurality of second exposure holes 19b are formed to vertically pass through the entire area. The first exposure hole 19a and the second exposure holes 19b provide paths through which sputtered particles pass in a sputtering process. The first exposure area 18a may be larger than the second exposure area 18b. For example, the first exposure area 18a may be formed to have an exposure area per unit area larger than that of the second exposure area 18b. Here, the exposure area may refer to an area of the first exposure hole 19a or the second exposure hole 19b. The exposure area per unit area may refer to a ratio of a total area of each of the first exposure hole 19a and the second exposure holes 19b to a total area of each of the first exposure area 18a and the second exposure area 18b. The exposure area per unit area may refer to a ratio of an area through which sputtered particles pass to a total area.

The first exposure area 18a is an area located on a deposition layer to be formed to have a first thickness, and the second exposure area 18b is an area located on a deposition layer to be formed to have a second thickness smaller than the first thickness. For example, when the shielding plate 17 is used in the process of manufacturing the semiconductor memory device according to the exemplary embodiment of FIG. 1, the first exposure area 18a is located on the first memory area 100a and the second exposure area 18b is located on the second memory area 100b. Since the first exposure area 18a has a large exposure area per unit area, the first exposure area 18a may expose a relatively large area of the first memory area 100a. Since the second exposure area 18b has a small exposure area per unit area, the second exposure area 18b may expose a small area of the second memory area.

The shielding plate 17 is located on the wafer holder 13 to be spaced apart from the upper surface of the semiconductor wafer 1. The shielding plate 17 may be coupled to the supporting bar 13c of the wafer holder 13 and may rotate with the wafer holder 13. The sputtered particles may pass through the second exposure holes 19b. For example, the sputtered particles may be obliquely incident on the upper surface of the shielding plate 17, pass through the second exposure holes 19b, and be deposited on the semiconductor wafer 1. Further, since the shielding plate 17 rotates with the wafer holder 13 and the semiconductor wafer 1, an angle at which the sputtered particles pass through the second exposure holes 19b may be continuously changed. Therefore, the sputtered particles may be uniformly deposited on each of the first memory area 100a located below the first exposure area 18a and the second memory area 100b located below the second exposure area 18b. The deposition layer may be deposited on the first memory area 100a and the second memory area 100b to have different thicknesses due to the effect of the first exposure hole 19a and the second exposure holes 19b. Since the second memory area 100b is partially shielded by the second exposure holes 19b, the deposition layer deposited on the second memory area 100b may be deposited to have a relatively thinner thickness than the deposition layer deposited on the first memory area 100a.

The shielding plate 17 may be spaced a separation height of 0.5 cm to 1.0 cm from the upper surface of the semiconductor wafer 1. For example, the shielding plate 17 may be distant from the upper surface of the semiconductor wafer 1 at a distance between 0.5 cm to 1.0 cm. The separation height of the shielding plate 17 may affect a deposition thickness of the area in which the sputtered particles are deposited, a deposition thickness of the deposition layer, and a deviation between the deposition thicknesses. The separation height may be controlled in consideration of a size of the second exposure hole 19b, a separation distance between the second exposure holes 19b, or the like. When the separation height is too low, the sputtered particles may be mainly deposited in an area immediately below the second exposure hole 19b, and the deposition thickness may be increased. When the separation height is too low, a difference between a deposition thickness of an area under the second exposure holes 19b in the second exposure area 18b and a deposition thickness of an area away from the second exposure holes 19b may be increased. When the separation height is too high, the sputtered particles passing through each of the first exposure hole 19a and the second exposure holes 19b may be deposited on each of the second exposure area 18b and the first exposure area 18a adjacent thereto or another area. Therefore, the difference between a deposition thickness of the area under the second exposure holes 19b in the second exposure area 18b and the deposition thickness of the area away from the second exposure holes 19b may be reduced. In an exemplary embodiment, a width of each of the shielding bars 17b, a separation distance between two adjacent shielding bars of the shielding bars 17b, or a separation height of the shielding plate 17 from an upper surface of the semiconductor wafer 1 may be controlled such that a deposition layer to be deposited on the semiconductor wafer 1 has a predetermined thickness.

The shielding frame 17a has a ring shape, and the first exposure area 18a and the second exposure areas 18b are located at an inside of the shielding frame 17a. The present inventive concept is not limited thereto. For example, the shielding frame 17a may have a shape of a rectangular ring, a hexagonal ring, or the like according to a shape of the substrate. The shielding frame 17a may be formed so that an inside area thereof has an area larger than that of the semiconductor wafer 1 on which a sputtering process is performed. For example, the shielding plate 17 may be formed to have an inner diameter or a width greater than a diameter of the semiconductor wafer 1.

The shielding bar 17b has a bar shape having a predetermined thickness. A shape of the shielding bar 17b perpendicular to its longitudinal direction may be a rectangular shape. The shielding bar 17b in plural may extend in a first direction y in the second exposure area 18b and may be spaced apart from each other in a second direction x. For example, the shielding bar 17b may be located to have a stripe shape or a line shape. In this case, the second exposure holes 19b may extend in the first direction y, may be spaced apart from each other in the second direction x, and may be formed to have a rectangular shape having a length corresponding to a length of the shielding bar 17b. The second exposure holes 19b may be located to have a line shape which extends in the first direction y and may be spaced apart from each other in the second direction x. A thickness of the deposited deposition layer in the second memory area 100b located below the second exposure area 18b may be adjusted according to a width w1 of the shielding bar 17b, a separation distance w2 between two adjacent shielding bars of the shielding bar 17b in plural, and a height d of the shielding plate 17 from the semiconductor wafer 1.

When the shielding bar 17b is formed to have a rectangular bar shape, the shielding bar 17b may be formed to have a width of 5 μm to 50 μm. When the shielding bar 17b is formed to have a circular bar shape, the shielding bar 17b may be formed to have a diameter of 5 μm to 50 μm. When the width w1 or the diameter of the shielding bar 17b is too small, strength thereof may be reduced and it may be difficult to uniformly form the second exposure holes 19b. When the width w1 or the diameter of the shielding bar 17b is too large, a size of each of the second exposure holes 19b through which the sputtered particles pass may be reduced and it may be difficult to secure a required thickness of the deposition layer. The separation distance w2 of the shielding bar 17b in plural may be 50 μm to 500 μm. When the separation distance w2 of the shielding bar 17b in plural is too small, the size of the second exposure hole 19b may be reduced and it may be difficult to secure a required deposition thickness of the deposition layer. Further, the difference between the deposition thickness of the area under the second exposure holes 19b in the second exposure area 18b and the deposition thickness of the area away from the second exposure holes 19b may be increased. When the separation distance w2 of the shielding bars 17b is too large, the number of the shielding bar 17b in plural which may be located in the second exposure area 18b may be significantly reduced. Therefore, when the separation distance w2 of the shielding bars 17b is too large, it may be difficult to control the deposition thickness of the deposition layer.

According to an exemplary embodiment, referring to FIGS. 13A and 13B, a shielding plate 27 includes a shielding frame 17a, first shielding bars 27c, and second shielding bars 27d. The shielding plate 27 includes a first exposure area 28a and a second exposure area 28b. The first exposure area 28a is an area in which a first exposure hole 29a is formed, and the second exposure area 28b is an area in which second exposure holes 29b are formed. The first shielding bars 27c extend in a second direction x and are spaced apart from each other in a first direction y. The second shielding bars 27d extend in the first direction y and are spaced apart from each other in the second direction x. The first shielding bars 27c and the second shielding bars 27d are located to form a grid shape. The second exposure holes 29b of the shielding plate 27 have a rectangular shape, and are arranged to have a grid shape spaced apart from each other in the first direction y and the second direction x. Each of the first shielding bars 27c and the second shielding bars 27d may be formed to have the same width or the same separation distance as that of each of the shielding bars 17b of FIGS. 11A to 11C. Each of the first shielding bars 27c and the second shielding bars 27d may be formed to have a width of 5 μm to 50 μm. The first shielding bars 27c may be spaced apart from each other at a separation distance of 50 μm to 500 μm. The second shielding bars 27d may be spaced apart from each other at a separation distance of 50 μm to 500 μm. The shielding plate 27 may reduce the thickness of the deposition layer deposited on the second memory area 100b because an area shielded in the second exposure areas 28b relatively increases compared to the shielding plate 17 of FIG. 11B.

Referring to FIG. 14, in the semiconductor memory manufacturing apparatus 10 according to the present inventive concept, a deposition thickness of the deposition layer 1a deposited on the first memory area 100a located below the first exposure areas 18a and a deposition thickness of the deposition layer 1b deposited on the second memory area 100b located below the second exposure areas 18b may be different from each other. The semiconductor memory manufacturing apparatus 10 may deposit the deposition layers so that the deposition thickness of the deposition layer 1a deposited on the first memory area 100a is greater than the deposition thickness of the deposition layer 1b deposited on the second memory area 100b.

In the semiconductor memory manufacturing apparatus 10, the sputtered particles from the sputtering targets held by the sputtering target holders 15 may pass through a first exposure hole 19a of the first exposure area 18a and second exposure holes 19b of the second exposure area 18b while being obliquely incident on the upper surface of the shielding plate 17, and may be deposited on the upper surface of the semiconductor wafer 1. Since the first exposure area 18a includes one first exposure hole 19a, the sputtered particles incident on the first exposure area 18a may be uniformly deposited on the first memory area 100a. Since the second exposure area 18b includes the second exposure holes 19b divided by shielding bars 17b, some of the sputtered particles incident on the second exposure area 18b may pass through the second exposure holes 19b and may be deposited on the second memory area 100b, and some of the sputtered particles may be deposited on the upper surface of the shielding bars 17b. Since a relatively small amount of the sputtered particles is deposited on the second memory area 100b, the deposition thickness of a deposition layer 1b in the second memory area 100b may be thinner than that of a deposition layer 1a in the first memory area 100a.

Since the sputtered particles are obliquely incident on the upper surface of the shielding plate 17, the sputtered particles may obliquely pass through the second exposure holes 19b. The sputtered particles may be deposited on a portion of the second memory area 100b under the second exposure hole 19b and a portion of the second memory area 100b under the shielding bar 17b. Further, since the shielding plate 17 and the semiconductor wafer 1 constantly rotate during the sputtering process, the sputtered particles may be uniformly deposited on the entire area of the second memory area 100b. When the shielding plate 17 and the semiconductor wafer 1 are located at predetermined positions, the sputtered particles (illustrated by solid lines) may be obliquely incident thereon from an upper right side to a lower left side and deposited thereon. When the shielding plate 17 and the semiconductor wafer 1 rotate, the sputtered particles (illustrated by dotted lines) may be obliquely incident thereon from an upper left side to a lower right side and deposited thereon. Therefore, in the second memory area 100b, the sputtered particles may be uniformly incident on the lower portion of the shielding bar 17b and deposited thereon.

According to an exemplary embodiment of the present inventive concept, memory devices having different characteristics may be formed in one semiconductor memory device by one process.

According to an exemplary embodiment of the present inventive concept, a memory device having a high retention characteristic and a memory device having a high operating speed may be formed in one semiconductor memory device by one process.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor memory device, comprising:
   a first memory device including a first magnetoresistive cell having a plurality of deposition layers; and
   a second memory device including a second magnetoresistive cell having a plurality of deposition layers,
   wherein each of the plurality of deposition layers of the second magnetoresistive cell corresponds to one of the plurality of deposition layers of the first magnetoresistive cell, and
   wherein one of the plurality of deposition layers of the second magnetoresistive cell comprises a substantially uniform thickness and is thinner than a corresponding deposition layer of the plurality of deposition layers of the first magnetoresistive cell, the corresponding deposition layer of the plurality of deposition layers of the first magnetoresistive cell comprising a substantially uniform thickness.

2. The semiconductor memory device of claim 1, further comprising:
   a lower insulating layer disposed on a substrate;
   a first lower contact plug and a second lower contact plug vertically passing through the lower insulating layer to be in contact with an upper surface of the substrate,
   wherein the first memory device is electrically connected to the first lower contact plug, and
   wherein the second memory device is electrically connected to the second lower contact plug;
   an upper insulating layer disposed on the lower insulating layer to cover the first memory device and the second memory device;
   an upper contact plug vertically passing through the upper insulating layer to be electrically connected to the first memory device or the second memory device; and
   a switching device electrically connected to the first lower contact plug.

3. The semiconductor memory device of claim 1, wherein:
   the plurality of deposition layers of the first magnetoresistive cell include a first fixed layer, a first tunnel barrier layer, a first free layer, and a first capping layer stacked on each other; and
   the plurality of deposition layers of the second magnetoresistive cell include a second fixed layer, a second tunnel barrier layer, a second free layer, and a second capping layer stacked on each other.

4. The semiconductor memory device of claim 3, wherein the one of the plurality of deposition layers of the second magnetoresistive cell is the second capping layer and the corresponding deposition layer of the plurality of deposition layers of the first magnetoresistive cell is the first capping layer.

5. The semiconductor memory device of claim 3, wherein the first capping layer has a thickness between 0.7 nm and 1.5 nm, and the second capping layer has a thickness between 0.1 nm and 0.7 nm.

6. The semiconductor memory device of claim 3, wherein the one of the plurality of deposition layers of the second magnetoresistive cell and the corresponding deposition layer of the plurality of deposition layers of the first magnetoresistive cell are simultaneously formed by one process.

7. The semiconductor memory device of claim 3, wherein the first capping layer and the second capping layer are simultaneously formed by one process.

8. The semiconductor memory device of claim 1, wherein the first magnetoresistive cell includes a first capping layer, a first free layer, a first tunnel barrier layer, and a first fixed layer stacked on each other; the second magnetoresistive cell includes a second capping layer, a second free layer, a second tunnel barrier layer, and a second fixed layer stacked on each other; and the one of the plurality of deposition layers of the second magnetoresistive cell is the second capping layer and the corresponding deposition layer of the plurality of deposition layers of the first magnetoresistive cell is the first capping layer.

9. A semiconductor device, comprising:
a first memory device located in a first memory area;
a second memory device located in a second memory area; and
a circuit located in a logic area, the logic area being between the first memory area and the second memory area;
wherein the first memory device includes a first lower contact, a first lower electrode, a first fixed film, a first tunnel barrier layer, a first free layer, a first capping layer, and a first upper electrode,
wherein the second memory device includes a second lower contact, a second lower electrode, a second fixed film, a second tunnel barrier layer, a second free layer, a second capping layer, and a second upper electrode,
wherein the first tunnel barrier layer and the second tunnel barrier layer substantially have a same thickness, and
wherein the first capping layer is thicker than the second capping layer.

10. The semiconductor device of claim 9, wherein the first fixed film includes a first lower fixed layer and a first upper fixed layer,
wherein the second fixed film includes a second lower fixed layer and a second upper fixed layer,
wherein the first lower fixed layer and the second lower fixed layer include a first material, and
wherein the first upper fixed layer and the second upper fixed layer include a second material different from the first material.

11. The semiconductor device of claim 10, wherein the first lower fixed layer and the second lower fixed layer do not include CoFeB, and wherein the first upper fixed layer and the second upper fixed layer include CoFeB.

12. The semiconductor device of claim 10, wherein the first fixed film further includes a first exchange fixed layer between the first lower fixed layer and the first upper fixed layer,
wherein the second fixed film further includes a second exchange fixed layer between the second lower fixed layer and the second upper fixed layer, and
wherein the first exchange fixed layer and the second exchange fixed layer include at least one of ruthenium, iridium, or rhodium.

13. The semiconductor device of claim 9, wherein the first capping layer and the second capping layer include metal oxide at least one of tantalum, magnesium, titanium, copper, aluminum, or ruthenium.

14. The semiconductor device of claim 9, wherein:
the first fixed film and the second fixed film are physically separated,
the first tunnel barrier layer and the second tunnel barrier layer are physically separated, and
the first capping layer and the second capping layer are physically separated.

15. The semiconductor device of claim 9, wherein:
the first free layer and the second free layer have a same thickness,
bottom surfaces of the first free layer and the second free layer are located at a same level, and
top surfaces of the first free layer and the second free layer are located at a same level.

16. The semiconductor device of claim 9, wherein:
bottom surfaces of the first capping layer and the second capping layer are located at a same level, and
a top surface of the first capping layer is located at a higher level than a top surface of the second capping layer.

17. A semiconductor device, comprising:
a first memory device located in a first memory area;
a second memory device located in a second memory area; and
a circuit for controlling the first and the second memory devices located in a logic area;
wherein the first memory device includes:
a first lower contact;
a first lower electrode on the first lower contact;
a first fixed film on the first lower electrode;
a first tunnel barrier layer on the first fixed film;
a first free layer on the first tunnel barrier layer;
a first capping layer on the first free layer; and
a first upper electrode on the first capping layer,
wherein the second memory device includes:
a second lower contact;
a second lower electrode on the first lower contact;
a second fixed film on the first lower electrode;
a second tunnel barrier layer on the first fixed film;
a second free layer on the second tunnel barrier layer;
a second capping layer on the first free layer; and
a second upper electrode on the first capping layer,
wherein the first tunneling barrier layer and the second tunneling barrier layer substantially have a same thickness, and
wherein the first capping layer is thicker than the second capping layer.

18. The semiconductor device of claim 17, wherein the first fixed film includes a first lower fixed layer and a first upper fixed layer, wherein the second fixed film includes a second lower fixed layer and a second upper fixed layer, wherein the first lower fixed layer and the second lower fixed layer include at least one of CoPt, CoPd, FePt, FePd, CoFeTb, CoFeDy, or CoFeGd, and wherein the first upper fixed layer and the second upper fixed layer include at least one of CoFeB, CoFeTa, CoFeTb, CoFeDy, CoFeGd, CoFePt, CoFe, CoPt, or FeB.

19. The semiconductor device of claim 18, wherein the first lower fixed layer and the second lower fixed layer do not include CoFeB, and wherein the first upper fixed layer and the second upper fixed layer include CoFeB.

20. The semiconductor device of claim 19, wherein the logic area is between the first memory area and the second memory area.

* * * * *